(12) United States Patent
Igura

(10) Patent No.: US 6,205,192 B1
(45) Date of Patent: Mar. 20, 2001

(54) CLOCK INPUT CONTROL CIRCUIT

(75) Inventor: Hiroyuki Igura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/145,262

(22) Filed: Sep. 2, 1998

(30) Foreign Application Priority Data

Sep. 3, 1997 (JP) .................................................. 9-237572

(51) Int. Cl.[7] .................................................. G06F 1/04
(52) U.S. Cl. .................. 375/354; 375/377; 713/322; 713/601; 327/142
(58) Field of Search .................. 375/354, 377; 713/322, 324, 400, 601; 327/141, 142

(56) References Cited

U.S. PATENT DOCUMENTS

| 5,404,459 | * | 4/1995 | Gulick et al. | 395/275 |
| 5,903,601 | * | 5/1999 | Elnashar et al. | 375/220 |
| 5,979,930 | * | 11/1999 | Furuta et al. | 713/601 |

FOREIGN PATENT DOCUMENTS

| 51-86955 | 7/1976 | (JP) . |
| 1-120663 | 5/1989 | (JP) . |
| 4-232517 | 8/1992 | (JP) . |
| 6-51863 | 2/1994 | (JP) . |
| 6-152695 | 5/1994 | (JP) . |
| 8-202469 | 8/1996 | (JP) . |
| 8-202654 | 8/1996 | (JP) . |

* cited by examiner

Primary Examiner—Amanda T. Le
(74) Attorney, Agent, or Firm—Sughrue, Mion, Zinn, Macpeak & Seas, PLLC

(57) ABSTRACT

In response to the inputting of an asynchronous signal (DATA) which is not synchronized with a clock signal, the inputting of the clock signal to the inside of the device is controlled to an on-state. Further, in response to the termination of the operation of the device, the inputting of the clock signal to the inside of the device is controlled to an off-state. In this case, the level change of the asynchronous signal is detected by a comparator, and based on the detection result, the inputting of the clock signal is controlled to either the on-state or the off-state by a clock control circuit. By stopping the inputting of the clock signal, the power consumption of the device can be reduced.

13 Claims, 5 Drawing Sheets

CLOCK INPUT CONTROL CIRCUIT

BACKGROUND OF THE INVENTION

1. Field of the Invention

The present invention is related to a clock input control circuit, and particularly to a clock input control circuit which controls on/off of the inputting of a clock signal for synchronizing the operation in a device.

2. Description of the Related Art

Generally, in an LSI (Large Scale Integrated Circuit), there is provided an interface control circuit for use with the passing of external signals and data for internal circuits. Provided in this interface control circuit are circuit blocks such as shown in FIG. 6. That is, there are provided circuit blocks such as a parallel port 15 for internally receiving parallel data or outputting them to the outside, a serial port 16 for passing serial data, and an interruption control circuit 17 for accepting external interruptions. In addition, reference numeral 18 is a processor core, and 19 is an LSI chip. In the same figure, parallel data, serial data, and interruption data represent external data signals. These data are not synchronized with the internal clock signal. Such signals are called asynchronous signals. If such asynchronous signal is directly processed in the circuits within the LSI, a malfunction due to timing violation can be caused. Thus, the processing in the internal circuits requires synchronization with the internal clock. For this, usually the synchronization of an external asynchronous signal 118 with an internal clock 120 is performed using a synchronizing circuit as shown in FIG. 7.

That is, a flip-flop (FF) 20 having an asynchronous signal input to the input terminal 118 is used, and the internal clock of the device is applied to the clock input terminal 120 of the FF 20. By such synchronizing circuit, a synchronizing signal synchronized with the internal clock is obtained from the output terminal 119.

The above described circuit had a defect that it was difficult to make the power consumption low by clock gating, or the effect on it was low.

One of the conventional techniques for achieving a digital circuit of low power consumption is clock gating. The clock gating is a technique in which a gate circuit is interposed at some midpoint of a clock tree to stop the clock given to the blocks in a predetermined range, thereby for reducing the power consumption. If the clock gating is performed, the operation of a block for which the clock is stopped by the clock gating also stops. Accordingly, this technique can be used only if the time over which the particular block is not used is known.

However, for a circuit block to which an external asynchronous signal is input, the timing of change in the a synchronous signal is unknown to the internal circuit. Thus, the period of time during which the clock is stopped could not be set, so the power consumption reduction method by the clock gating technique could not be used.

An art for solving the above problem is described in Published Unexamined Patent Application No. 8-202654. In this publication, a technique is proposed in which the operation rate of the internal circuit is reduced by synchronizing the sampling cycle of a circuit for synchronizing an external asynchronous signal with the clock cycle of an external signal which generally has a longer cycle than the internal clock signal.

However, in this technique, since the operation is si performed in synchronism with the clock cycle of the external gnal even in the period over which the external asynchronous signal performs no operation, there is a defect that the effect of enabling low power consumption by the clock gating is limited.

SUMMARY OF THE INVENTION

The present invention was made to solve the above described defect of the prior art, and its object is to provide a clock input control circuit which controls on/off of the inputting of the clock signal for synchronizing the operation within the device, thereby for enabling the power consumption of the device to be reduced.

A clock input control circuit for controlling on/off of the inputting of a clock signal for synchronizing the operation within a device, characterized by including an input control means for controlling the inputting of the clock signal to the inside of the device to an on-state in response to the inputting of an asynchronous signal which is not synchronized with the clock signal.

A clock input control circuit characterized in that the above input control means controls the inputting of the clock signal to the inside of the device to an off-state in response to the termination of the operation of the device.

In brief, the subject clock input control circuit detects a level change of the asynchronous signal, and based on the detected result, controls the inputting of the clock signal to the inside of the device to either the on-state or the off-state. And the power consumption of the device can be made low by controlling the inputting of the clock signal to the inside of the device to the off-state.

DESCRIPTION OF THE PREFERRED EMBODIMENT

Now, the first embodiment of the present invention is described with reference to the drawings.

Figure 1:
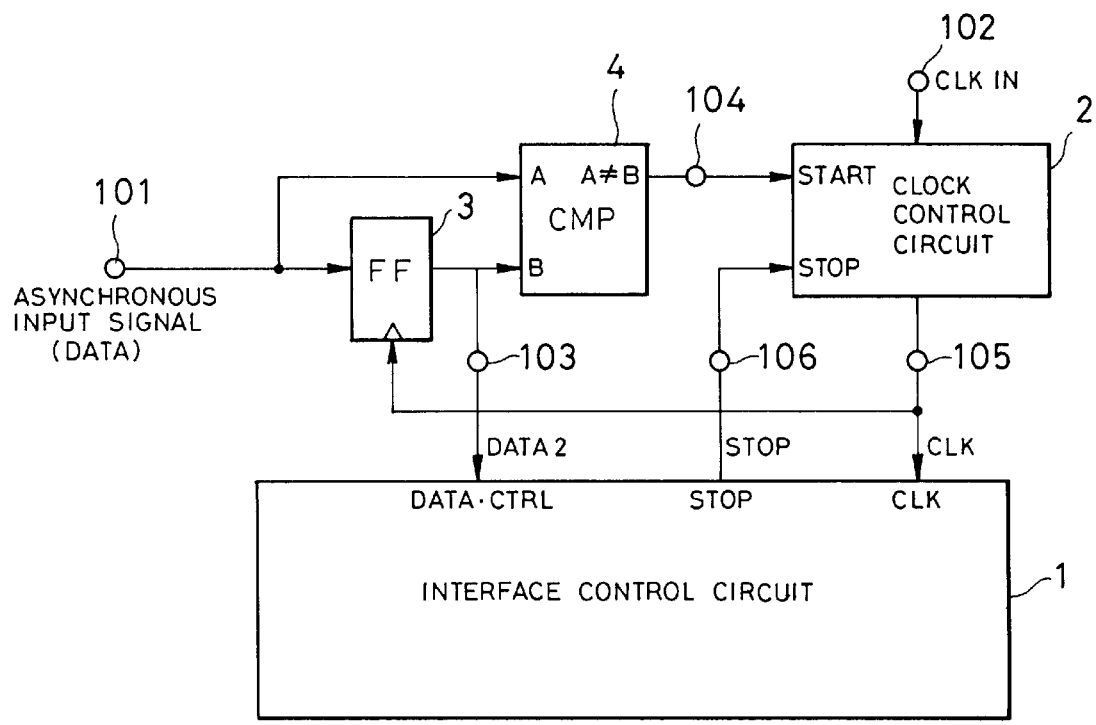
FIG. 1 is a block diagram showing the construction of the clock input control circuit according to the first embodiment of the present invention.

FIG. 1 is a block diagram showing an embodiment of the clock input control circuit according to the present invention. In the same figure, an asynchronous input signal DATA of any number of bits (hereinafter referred to as n bits) is provided to an terminal 101, and the terminal 101 is connected to the input terminal of a flip-flop circuit 3 and to one input terminal of an n-bit comparator (CMP) 4. The output terminal of the flip-flop circuit 3 is connected to a terminal 103, and the terminal 103 is connected to the other input terminal of the comparator 4 and an interface control circuit 1. The output terminal of the comparator 4 is connected to a terminal 104, and the terminal 104 is connected to the start input terminal of a clock control circuit 2. A clock input terminal 102 is connected to the clock input terminal of the clock control circuit 2, and the clock output terminal of the clock control circuit 2 is connected to a terminal 105, and the terminal 105 is connected to the respective input terminals of the interface control circuit 1 and the flip-flop circuit 3. The clock stop control output terminal of the interface control circuit 1 is connected to a terminal 106, and the terminal 106 is connected to the clock stop input terminal of the clock control circuit 2.

Figure 2:
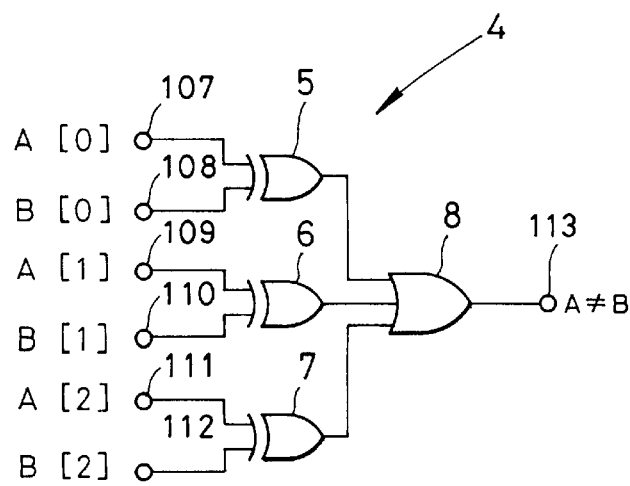
FIG. 2 is a circuit diagram showing a construction example of the comparator in FIG. 1.

An example of the comparator 4 is shown in FIG. 2. In this example, a 3-bit comparator is shown. The signal A[0] of the bit 0 of a 3-bit input signal A and the signal B[0] of the bit 0 of a 3-bit input signal B are input to an XOR circuit 5, the input signal A[1] of the bit 1 of the input signal A and the signal B[1] of the bit 1 of the input signal B to an XOR circuit 6, the signal A[2] of the bit 2 of the input signal A and the signal B[2] of the bit 2 of the input signal B to an XOR circuit 7, and the output signals of these XOR circuits are input to an OR circuit 8. The output signal of the OR circuit 8 becomes "1" if A[0]≠B[0], A[1]≠B[1], or A[2]≠B[2]. That is, it becomes "1" if the 3-bit input signal A and the 3-bit input signal B are different.

Figure 3:
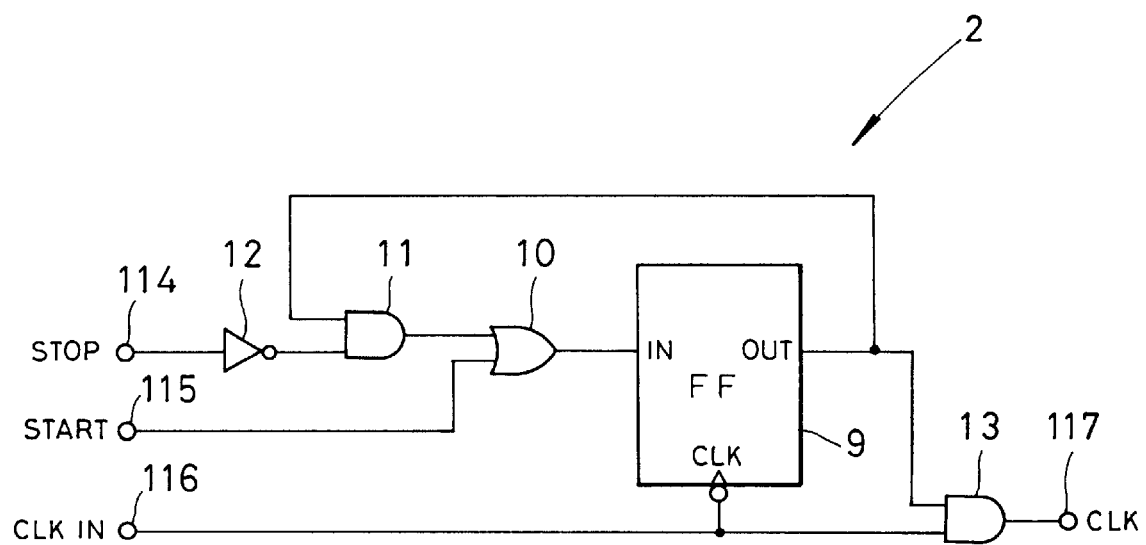
FIG. 3 is a circuit diagram showing a construction example of the clock control circuit in FIG. 1.

An example of the clock control circuit 2 is shown in FIG. 3. A clock stop signal STOP is provided to a terminal 114, and the terminal 114 is connected to the input terminal of an inverter 12. The output terminal of the inverter 12 is connected to one input terminal of an AND circuit 11. The output terminal of the AND circuit 11 is connected to one input terminal of an OR circuit 10. A clock restart signal START is provided to a terminal 115, and the terminal 115 is connected to the other input terminal of the OR circuit 10. The output terminal of the OR circuit 10 is connected to the data input terminal of a flip-flop circuit 9, and the data output terminal of the flip-flop circuit 9 is connected to the other input terminal of the AND circuit 11 and one input terminal of an AND circuit 13. An input clock signal CLKIN is provided to a terminal 116, which is connected to the clock input terminal of the flip-flop 9 and the other input terminal of the AND circuit 13. The output terminal of the AND circuit 13 is connected to a terminal 117, providing a clock signal CLK. In addition, the flip-flop circuit 9 herein assumes a falling-edge triggered flip-flop.

With such construction, since the signal at the data input terminal IN of the flip-flop 9 becomes "1" if the clock restart signal START is "1," 1 is latched if the clock input signal CLKIN falls at this point of time, and the signal at the output terminal OUT of the flip-flop 9 becomes "1." Then, the AND circuit 13 allows the input clock signal CLKIN to pass to the output terminal thereof, whereby the clock signal is output to the output terminal 117.

At this point, if the clock stop signal STOP is "0," the output of the inverter 12 becomes "1," and the AND circuit 11 allows the state of the output terminal of the flip-flop circuit 9 to pass without changing it. Thus, even if the clock restart signal START becomes "0" and the fall of the input clock signal CLKIN occurs, the output terminal of the flip-flop circuit 9 keeps the state of "1." If the clock restart signal START is "0" and the clock stop signal STOP is "1," the output of the inverter 12 becomes "0," and thus the output of the AND circuit 11 becomes "0," and the output of the OR circuit 10 also becomes "0." At this point, if the fall of the input clock signal CLKIN occurs, "0" is latched in the flip-flop circuit 9, and the output terminal of the flip-flop 9 also becomes "0." This causes the output of the AND circuit 13 to become "0," and the clock signal at the output terminal 117 stops.

That is, when the clock restart signal START becomes "1," the clock signal CLK is output to the terminal 117, and when the clock stop signal STOP becomes "1," the clock signal at the terminal 117 stops.

Figure 4:
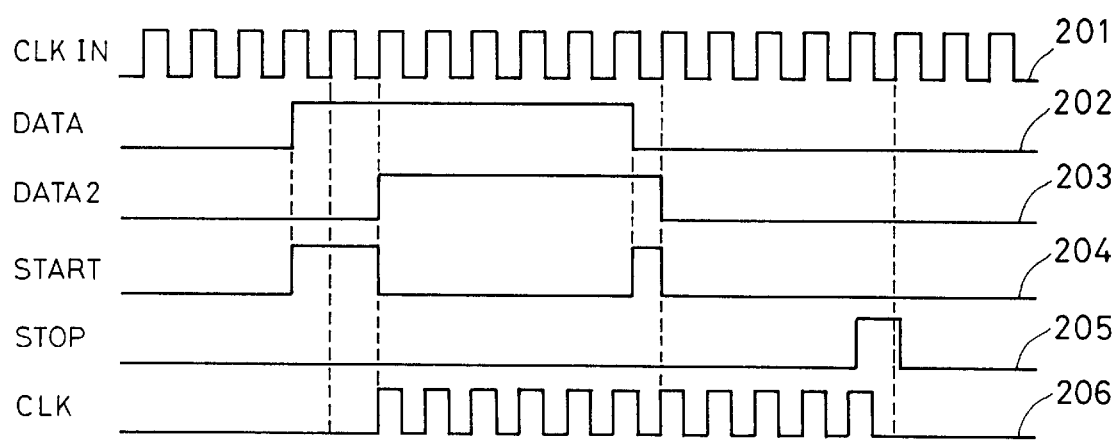
FIG. 4 is a timing chart showing the operation of each portion of FIG. 1.

Now, the operation of each portion of FIG. 1 is described with reference to the timing chart of FIG. 4. Waveforms 201, 202, 203, 204, 205, and 206 represent the operation examples of the waveforms at the terminals 102, 101, 103, 104, 106, and 105, respectively. If the asynchronous input signal DATA provided to the terminal 101 changes to a value different from the signal DATA2 latched in the flip-flop circuit 3, the output signal START of the comparator 4 becomes "1."

Then, the clock control circuit allows the input clock signal CLKIN to pass through, thereby outputting the clock signal CLK. At the rise of the clock signal CLK, the flip-flop circuit 3 latches the asynchronous input signal DATA, and outputs it as a latch signal DATA2.

Whereupon, the asynchronous input signal DATA equals to the latch signal DATA2, so the output signal START of the comparator 4 becomes "0." If the asynchronous input signal DATA changes again while the clock signal CLK is being output, and the output signal START of the comparator 4 again becomes "1," then the clock signal CLK is continuously output.

In this case, if the interface control circuit 1 is constructed so that the clock stop signal STOP is output when the processing of the asynchronous input signal in the interface control circuit 1 is completed, then the clock signal CLK stops again after the completion of the processing of the asynchronous input signal.

This construction allows the clock signal CLK to be input to the interface control circuit 1 only when this signal is needed, and thus the power consumption can be made low.

Figure 5:
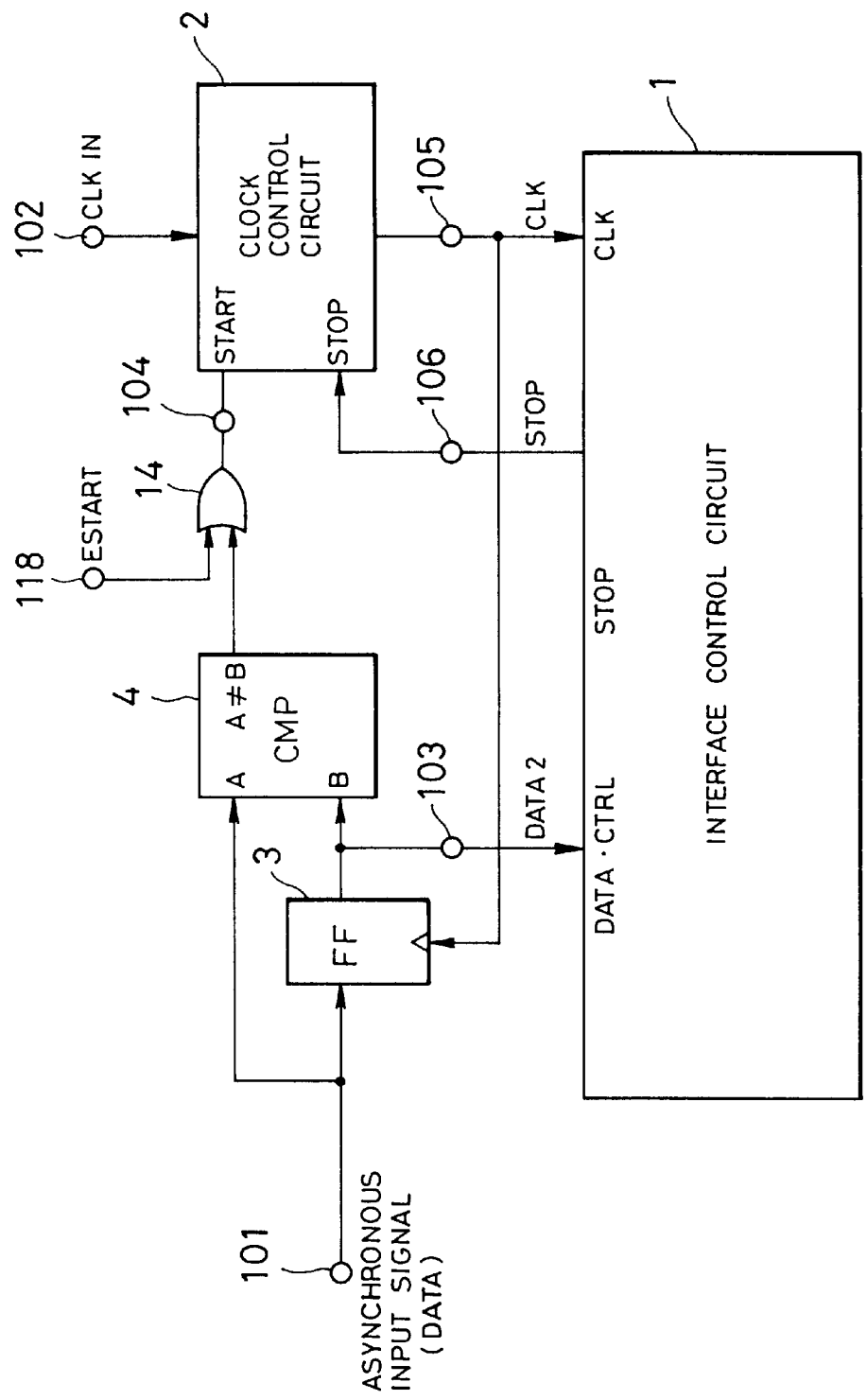
FIG. 5 is a block diagram showing the construction of the clock input control circuit according to the second embodiment of the present invention.
Figure 6:
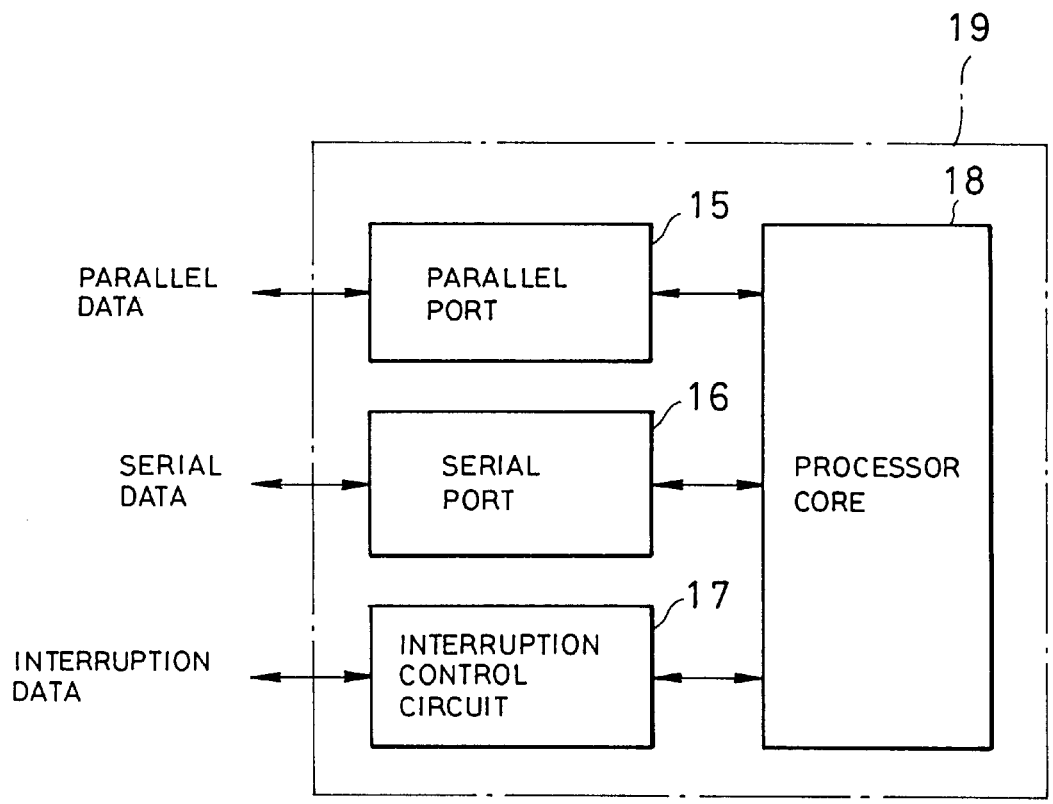
FIG. 6 is a block diagram showing the construction of the conventional clock input control circuit.
Figure 7:
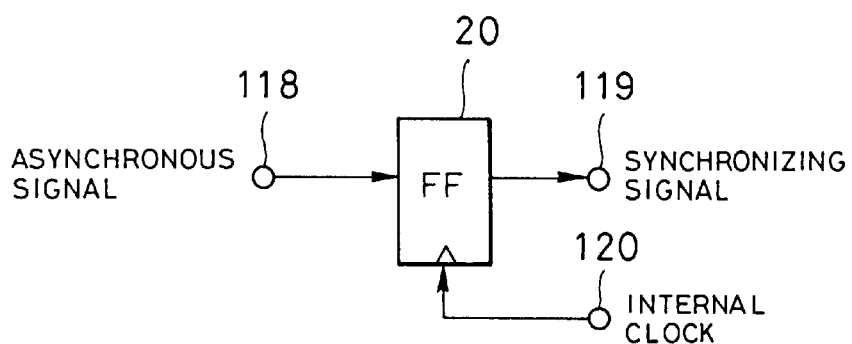
FIG. 7 is a block diagram showing a construction example of the synchronizing circuit for asynchronous signals.

The second embodiment of the present invention is shown in FIG. 5. In the same figure, the portions identical to FIG. 1 are represented by the same symbols, and the detailed description thereof is omitted. The embodiment of the same figure and the first embodiment are different in the point that an OR circuit 14 is interposed at the terminal 104 in FIG. 1 and a terminal 118 is connected to one input terminal of the OR circuit 14. Usually, the interface control circuit is often operated from a circuit block in an LSI, for instance, a processor core, as well as from an external asynchronous input signal. In such case, the construction of FIG. 1 enables the interface control circuit 1 to be activated only by an asynchronous input signal from the outside of the LSI. Then, if the clock restart signal START is given by ORing with an internal clock restart signal ESTART, which becomes active when an access is internally made, then the operation from an internal circuit block is also made possible. It is the second embodiment shown in FIG. 5 that accomplishes this.

Although the above description has been made to the case in which the clock input control circuit is provided in an LSI to reduce the power consumption, it is to be understood that this circuit can be provided in various devices including the interface circuit to reduce the power consumption.

Further, it is needless to say that the above described asynchronous signal includes various data such as serial data and parallel data which are input from external devices.

As described above, the present invention has an effect that the power consumption of a device can be reduced by controlling on/off of the inputting of a clock signal to the inside of the device in response to the inputting of an asynchronous signal.

What is claimed is:

1. A clock input control circuit for controlling on/off of the inputting of a clock signal for synchronizing the operation within a device, said clock input control means including an input control means which controls the inputting of said clock signal to the inside of said device to an on-state in response to the inputting of an asynchronous signal which is not synchronized with said clock signal.

2. A clock input control circuit as set forth in claim 1, wherein said input control means controls the inputting of said clock signal to the inside of said device to an off-state in response to the termination of the operation of said device.

3. A clock input control circuit as set forth in claim 1, wherein said input control means includes a level change detecting means for detecting a level change of said asynchronous signal, and a gate means for controlling the inputting of said clock signal to the inside of said device to either the on-state or the off-state in response to the detection result.

4. A clock input control circuit as set forth in claim 3, wherein said level change detecting means includes a latch circuit for latching said asynchronous signal by the clock signal the inputting of which is put in the on-state, and a comparator circuit for comparing the output of the latch circuit with the level of said asynchronous signal.

5. A clock input control circuit as set forth in claim 4, wherein said comparator circuit consists of exclusive OR circuits.

6. A clock input control circuit as set forth in claim 5, wherein said asynchronous signal is parallel data of a plurality of bits, said clock input control circuit including said exclusive OR circuit for each bit, and OR circuit for ORing the outputs of these exclusive OR circuits.

7. A clock input control circuit as set forth in claim 3, wherein said gate means includes an OR circuit for ORing the detection result at said level change detecting means with the signal output from said device, and a means for controlling the inputting of said clock signal to the inside of said device to either the on-state or the off-state in response to the result of the logical OR in the OR circuit.

8. A clock input control circuit a set forth in claim 3, wherein said gate means comprises a level inverting circuit for inverting the level of the signal output from said device, a first AND circuit having one input terminal to which the output of said level inverting circuit is input, an OR circuit for ORing the output of the first AND circuit with the detection result signal at said level change detecting means, a latch circuit for latching the output of the OR circuit by an input clock signal, and a second AND circuit for ANDing the output of the latch circuit with said input clock signal, wherein the output of said latch circuit is input to the other input terminal of said first AND circuit.

9. A clock input control circuit as set forth in claim 3, wherein an OR circuit for ORing the output of said level change detecting means with a clock restart signal is interposed between said level change detecting means and said gate means.

10. A clock input control circuit as set forth in claim 9, wherein said clock restart signal is a signal output from a device different from the device from which said asynchronous signal is output.

11. A clock input control circuit as set forth in claim 1, wherein said asynchronous signal is data input from an external device, and said operation is an operation of receiving said data.

12. A clock input control circuit as set forth in claim 1, wherein said input control means is provided in the interface to an external device.

13. A clock input control circuit as set forth in claim 1, wherein said asynchronous signal is serial data input from an external device.

* * * * *